United States Patent [19]

Okumura

[11] Patent Number: 4,952,993
[45] Date of Patent: Aug. 28, 1990

[54] SEMICONDUCTOR DEVICE AND MANUFACTURING METHOD THEREOF

[75] Inventor: Katsuya Okumura, Yokohama, Japan

[73] Assignee: Kabushiki Kaisha Toshiba, Kawasaki, Japan

[21] Appl. No.: 218,913

[22] Filed: Jul. 14, 1988

[30] Foreign Application Priority Data

Jul. 16, 1987 [JP] Japan .................................. 62-177887

[51] Int. Cl.⁵ ............................................ H01L 29/78
[52] U.S. Cl. .................................. 357/23.9; 357/23.3; 357/59
[58] Field of Search ............... 357/233, 55, 23.9, 59 I, 357/23.4, 23.11, 23.3

[56] References Cited

U.S. PATENT DOCUMENTS

| | | | |
|---|---|---|---|
| 3,881,242 | 5/1975 | Nuttall et al. | 357/59 I |
| 4,042,953 | 8/1977 | Hall | 357/59 I |
| 4,324,038 | 4/1982 | Chang et al. | 357/23.9 |
| 4,336,550 | 6/1982 | Medwin | 357/59 I |
| 4,536,782 | 8/1985 | Brown | 357/23.9 |
| 4,660,062 | 4/1987 | Nishizawa | 357/23.3 |
| 4,710,790 | 12/1987 | Okamoto et al. | 357/23.6 |
| 4,830,975 | 5/1989 | Bovaird et al. | 357/23.11 |

FOREIGN PATENT DOCUMENTS

| | | |
|---|---|---|
| 0142639 | 5/1985 | European Pat. Off. . |
| 0221624 | 5/1987 | European Pat. Off. . |
| 2724165 | 1/1977 | Fed. Rep. of Germany . |
| 3426306 | 4/1985 | Fed. Rep. of Germany . |
| 54-161889 | 12/1979 | Japan .................................. 357/23.3 |
| 61-102067 | 5/1986 | Japan . |
| 62-136877 | 6/1987 | Japan .................................. 357/23.3 |

Primary Examiner—William D. Larkins
Attorney, Agent, or Firm—Foley & Lardner, Schwartz, Jeffery, Schwaab, Mack, Blumenthal & Evans

[57] ABSTRACT

A semiconductor device comprising three recessed portions formed at a very small pitch on the surface of a semiconductor substrate, remaining regions formed between these recessed portions as impurity diffused regions serving as the source and the drain, respectively, and a conductive region as a gate electrode formed through an insulating film within the central recessed portion, and a method of manufacturing such a semiconductor device are disclosed. With this device, its gate length can be made shorter than that in the prior art and the junction leakage is reduced, resulting in miniaturization and an improvement in the characteristics.

2 Claims, 6 Drawing Sheets

SEMICONDUCTOR DEVICE AND MANUFACTURING METHOD THEREOF

BACKGROUND OF THE INVENTION

This invention relates to a semiconductor device and a manufacturing method thereof, and more particularly to a very Large Scale Integrated (LSI) MOS type semiconductor device to which miniaturization processing of submicron order is implemented and a manufacturing method thereof.

According as semiconductor devices have been integrated to high degree, components or elements become small in dimensions. Marked progress has been shown in respect of both the miniaturization processing technique and the structure of components.

In the field of the miniaturization processing, the miniaturization processing having a resolution of the minimum pattern of 0.6 μm can be carried out under the present circumstances. However, even if conventional MOS FETs are manufactured by using such a miniaturization processing technique, the size of field region is limited to 1.2 μm even at the minimum due to bird's beaks which occur during the selective oxidation. In addition, the sizes of the source and drain regions are limited even at the minimum due to bird's beak in the selective oxidation. In addition, the sizes of the source and drain regions are limited even at the minimum to a value obtained by adding 0.2 μm to the diameter of the contact hole, i.e., 0.6 μm+0.2 μm=0.8 μm in consideration of an electric withstand voltage across the side surface of the contact hole and the gate electrode, etc. When an alignment accuracy is taken into account, the limit value is further increased by approximately 0.15 μm. Accordingly, even if the alignment accuracy is disregarded, the conventional MOS FET is required to be 4.6 μm in dimensions even at the minimum. As just described above, the conventional MOS FET has a problem that the size thereof is greately ruled by factors, e.g., the dimension of the field region, the dimension of contact hole, and the alignment accuracy, etc., rather than it is prescribed by the sizes of the gate, or the source and drain regions, etc., so that the development of the miniaturization processing technique does not directly lead to the miniaturization of a MOS FET.

Further, in regard to the structure of transistors, if the gate region is reduced for miniaturization or fining of MOS FET, there arise problems that the short channel effect becomes conspicuous, that the hot electron effect is difficult to disregard. For relaxing the short channel effect, the thickness of the gate oxide film must be thinned. For preventing the hot electron effect, it is required to adopt an LDD (Lightly Doped Drain) structure in which a low concentration impurity diffused region is formed in a channel region between high concentration impurity diffused regions serving as the source/ the drain and a region directly below the gate, or similar structure. However, employment of such a structure leads to problems that the reliability and/or drivability of MOS FET are lowered, that the manufacturing process becomes complicated, and that the manufacturing margin is narrowed, resulting in lowering productivity.

SUMMARY OF THE INVENTION

Therefore, an object of this invention is to provide a semiconductor device miniaturized without lowering the reliability or characteristics and the productivity, and a manufacturing method thereof.

According to this invention, there is provided a semiconductor device comprising: a semiconductor substrate of one conductivity type; first, second and third recessed portions formed in succession at a predetermined pitch on the surface; a first remaining region formed between the first and second recessed portions, in which an impurity of an opposite conductivity type is diffused; a second remaining region formed between the second and third recessed portions, in which an impurity of the opposite conductivity type is diffused; and a gate region buried through an insulating film into the second recessed portion.

Further, according to this invention, there is provided a method of manufacturing a semiconductor device comprising: a first step for forming first, second and third recessed portions at a predetermined pitch on the surface of a semiconductor substrate of one conductivity type; a second step for diffusing an impurity of an opposite conductivity type into first and second remaining regions formed between the first and second recessed portions and between the second and third recessed portions; a third step for forming an oxide film serving as a gate oxide film over the entire surface; a fourth step for depositing a thin electrode layer serving as a gate electrode on the oxide film; a fifth step for removing the electrode layer on the first and third recessed portions; a sixth step for depositing an interlayer insulating film over the entire surface; a seventh step for removing the interlayer insulating film on the first and second remaining regions and within the second recessed portion; an eighth step for removing the electrode layer on the first and second remaining regions; a ninth step for allowing a region surrounded by the electrode layer within the second recessed portion to be provided with a low resistance conductive layer; and a tenth step for forming a wiring layer electrically connected to the two impurity regions and the electrode layer, respectively.

An implementation may be employed to deposit an electrode material by a thickness of an electrode onto the entire surface, to remove the electrode layer except a portion of the electrode layer within the second recessed portion, and to electrically draw out the first and second remaining regions and the electrode layer in second recessed portion, respectively.

In accordance with this invention, since a MOS FET including the field insulation is formed at three recessed portions and two protruding portions or projections interposed among three recessed portions in the semiconductor substrate formed at a minimum pitch where the fining or miniaturization processing is possible, miniaturization of the semiconductor device can be realized and the characteristics and reliability can be improved.

DESCRIPTION OF THE PREFERRED EMBODIMENT

Figure 1:
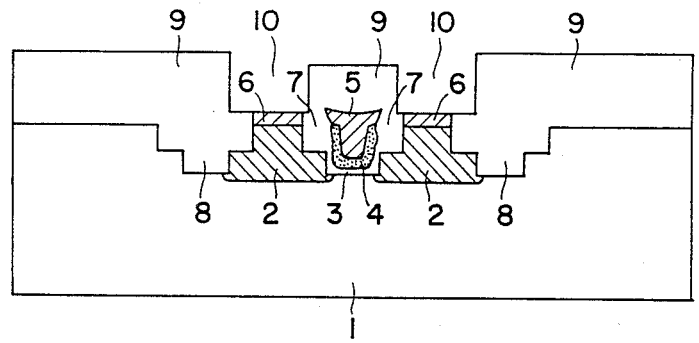
FIG. 1 is a partial cross sectional view showing a structure of a MOS-type semiconductor device according to this invention.

An embodiment of a semiconductor device according to this invention is shown in cross section in FIG. 1. On a semiconductor substrate 1 comprised of a silicon substrate, three recessed portions and two remaining regions in the form of protrusion or projection interposed among these three recessed portions are formed. These recessed portions and protruding regions are processed at a minimum pitch where fining or miniaturization processing is possible. In this embodiment, the width of the recessed portion is 0.8 μm, the width of the protruding region is 0.4 μm, and accordingly the pitch is 1.2 μm. An impurity, e.g., arsenic (As) is diffused in the two protruding regions to the bottoms thereof. Thus, N+ impurity diffused regions 2 as source and drain regions are formed. The portion directly below the bottom surface of the central recessed region interposed between these N+ impurity diffused regions 2 serves as a gate region. Namely, on the semiconductor substrate 1 of the bottom surface of this recessed region, a gate electrode 4 comprised of a polysilicon layer having a film thickness of 1000 Å is formed through a gate oxide film 3 having a film thickness of 150 Å. The gate electrode 4 in the recessed portion is provided with a tungsten layer 5 thereon. The upper end surface of the tungsten layer is flush with the surface of the semiconductor substrate. Tungsten layers 6 are also formed on the N+ impurity diffused regions 2. Between the upper side surfaces of the protruding portions of the N+ impurity diffused regions 2, spacers 7 comprised of a silicon oxide film are formed. In addition, a silicon oxide film and a BPSG layer are buried into both outer recessed portions. Thus, field insulations 8 are formed. Contact holes 10 are opened at predetermined positions of insulating layers 9 which have been deposited over the entire surface and then flattened by melting. The tungsten layers 6 on the N+ impurity diffused regions 2 and a wiring layer (not shown) are electrically connected through the contact holes 10. In this example, respective contact holes 10 are 0.7 μm in dimensions and are in alignment with the edge portions of the spacers 7 between which the gate electrode 4 is disposed. Moreover, the tungsten layer 5 on the gate electrode 4 is electrically connected to the wiring layer through a contact hole. However, such a connection is not indicated in FIG. 1 because it is implemented at other sites.

As just described above, in accordance with the semiconductor device according to this embodiment, MOS FET is formed so that it is 3.2 μm in dimensions even if an alignment accuracy of 0.15 μm is taken into account. As compared to the fact that conventional MOS FETs are required to be 4.6 μm in dimension at the minimum even in the case that an alignment accuracy is disregarded, the MOS FET according to this embodiment is reduced in dimensions to much extent. Thus, high integration of semiconductor devices can be realized.

Moreover, since this semiconductor device is such that the junctions of the source and drain regions are present at a deep position spaced from the electrode connecting surface, the problem of occurrence of junction leakage does not occur. In addition, since the tungsten layers 6 are put on the N+ impurity diffused regions 2, the sheet resistance is lowered. Thus, drivability of the transistor is improved and the delay in operation is lessend to a negligible extent.

Further, since the tungsten layer 5 is also put on the gate electrode 4, the sheet resistance of the gate electrode 4 is also reduced. Thus, the transistor characteristics are improved and the access speed becomes fast.

Furthermore, since the slope of the potential distribution at the boundary between the N+ impurity regions 2 as the source and drain regions and the gate region becomes gentle as compared to that in the conventional MOS FET, the short channel effect and/or the hot electron effect are abated, with the result that the necessity of adopting the LDD structure widely used in the conventional art is eliminated. Thus, a transistor having excellent characteristics and high reliability can be obtained.

It is to be noted that while the gate electrode 4 in the recessed portion is provided with a tungsten layer 5 thereon in accordance with the above-mentioned embodiment, a structure may be employed in which the polysilicon layer forming the gate electrode 4 is thickned so as to bury the recessed portion with that polysilicon layer instead of the tungsten layer 5.

Moreover, while the N-channel MOS FET has been described in the above-mentioned embodiment, this invention is also applicable to the P-channel MOS FET in the same manner.

Further, by employing hybrid configuration of the MOS FET in the above-mentioned embodiment and a certain conventional MOS FET, a semiconductor device may be manufactured.

Furthermore, while the MOS FET has been described in the above-mentioned embodiment, this invention is not limited to such a MOS FET, but is similarly applicable to the Schottky type FET (MES FET).

Figure 2A:
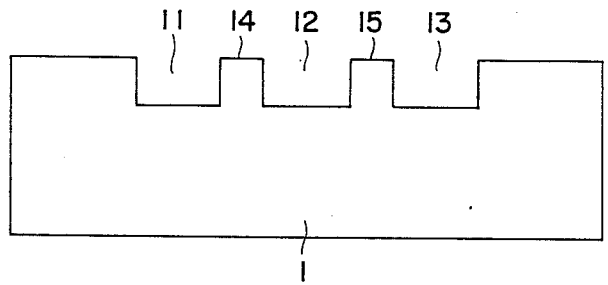
FIGS. 2A to 2L are cross sectional views of respective process steps showing a manufacturing method for realizing the structure shown in FIG. 1.

A method of manufacturing a semiconductor device of an embodiment according to this invention will be now explained with reference to FIG. 2. On a semiconductor substrate 1 comprised of silicon, three recessed portions 11, 12 and 13 are formed at a minimum pitch where fining or miniaturization processing is possible. Thus, two protruding remaining regions 14 and 15 interposed among these three recessed portions 11, 12 and 13 are formed. At this time, when, e.g., a positive photoresist is used, an application of over-exposure and over-development to a portion to be exposed readily makes it possible that the dimension of the unexposed portion is less than resolution. In this way, this embodiment has a dimensional relationship such that the widths of respective recessed portions 11, 12 and 13 are 0.8 82 m, the widths of respective protruding portions 14 and 15 are 0.4 μm, and the pitch is 1.2 μm. In addition, the recessed portions 11, 12 and 13 have a dimensional relationship such that their depths are 0.4 μm (FIG. 2A).

It is to be noted that while an explanation will be made by taking an example of a positive resist, a semiconductor device may be manufactured even with a negative resist in a manner similar to the above.

Figure 2B:
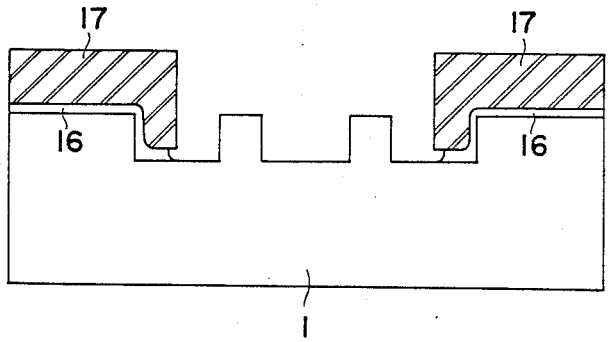

A silicon oxide film 16 is deposited onto the entire surface of the semiconductor substrate 1 using CVD (Chemical Vapour Deposition) method so that its thickness is equal to approx. 1000 Å. After a photoresist 17 is coated over the entire surface, parts of the photoresist 17 in the halves of the outer recessed portions 11 and 13, in the central recessed portion 12, and above the protruding portions 14 and 15 are removed. Subsequently, with the remaining photoresist 17 being as a mask, an exposed silicon oxide film 16 is removed by using the wet etching method (FIG. 2B).

Figure 2C:
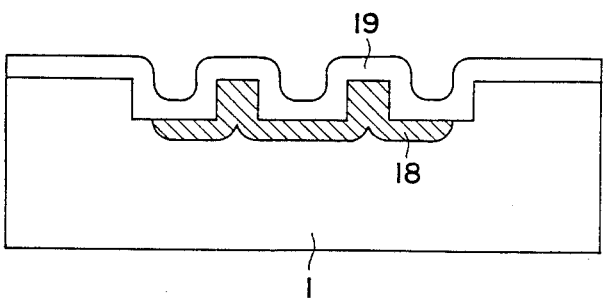

Then, after the remaining photoresist 17 is removed, arseno-silicate glass (ASG) is deposited onto the entire surface to diffuse arsenic (As) into the surface region of the semiconductor substrate 1, thus to form an N+ impurity diffused region 18. The diffusing condition is set so that the depth of diffusion becomes equal to approximately 0.2 μm. Thus, the protruding portions 14 and 15 serve as N+ impurity diffused region 18 to the bottoms thereof, respectively. After the arseno-silicate glass and the silicon oxide film 16 are removed, a silicon oxide film 19 is deposited onto the entire surface using CVD method for the second time (FIG. 2C).

Figure 2D:
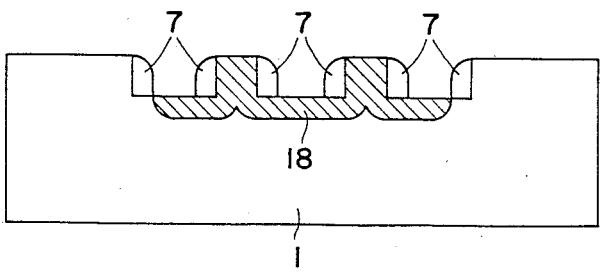
Figure 2E:
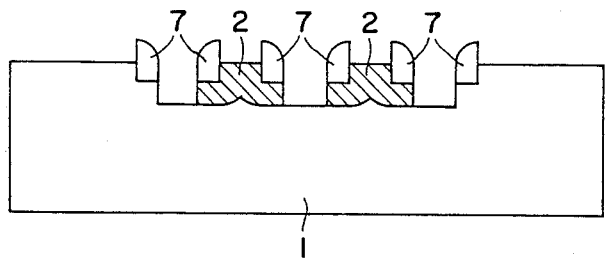

Using an etch back method, the silicon oxide film 19 is subjected to etching to thereby form spacers on the side surfaces of the protruding portions 14 and 15. The width of the spacer 7 is substantially determined by the film thickness of the silicon oxide film 19. In this embodiment, it is 0.2 μm (FIG. 2D). With the spacers being as a mask, etching of the semiconductor substrate 1 is carried out by using anisotropic etching method such as RIE (Reactive Ion Etching) method. By this etching, a part of the N+ impurity diffused region 18 on the bottom surface of the recessed portions 11, 12 and 13 is selectively removed. The etching depth for the N+ impurity diffused region 18 at this time is set greater than the diffusion depth thereof for the purpose of allowing the protruding portions 14 and 15 to be separated from each other. In this embodiment, this depth is over 0.2 μm. Thus, the N+ impurity diffused regions of the producing portions 14 and 15 which have been left at this step become N+ impurity diffused regions 2 as the source and drain regions, respectively (FIG. 2E).

Then, after a silicon oxide film is formed at a temperature of about 1000° C., the silicon oxide film thus formed is removed. By this process, acute edge portions of the bottom corner of the recessed portions 11, 12 and 13 are caused to be round, and the N+ impurity diffused regions 2 extend into the bottom surface of the central recessed portion 12 to a small extent. This can prevent that the slope of potential distribution at the boundary between the N+ impurity diffused regions as the source and drain regions and the gate region becomes steep.

Figure 2F:
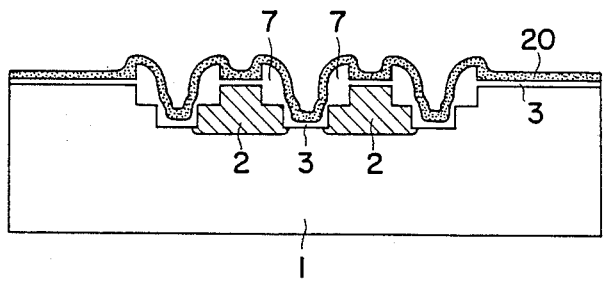

After the cleaning of the semiconductor substrate 1 is sufficiently carried out, thermal oxidation is conducted at a temperature of about 900° C. to form gate
oxide film 3 so that its thickness is equal to 150 Å. Then, after a polysilicon layer 20 is deposited onto the entire surface by using the low pressure CVD method so that its thickness is equal to approx. 1000 Å, phosphorus (P) ions are doped (FIG. 2F). At this time, the impurity concentration is set to a relatively small value, thus to effect a control such that sheet resistance (area resistivity) is equal to approx. 1 Ω/□. It is to be noted that arsenic (As) may be doped as the impurity in place of phosphorus (P).

Figure 2G:
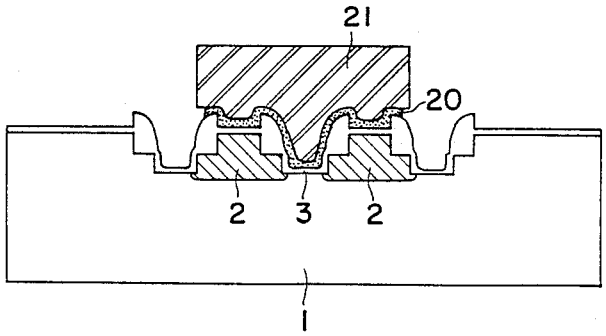

After a photoresist 21 is coated onto the entire surface, patterning is implemented, thus allowing the photoresist 21 to remain above the N+ impurity diffused regions 2 as the source and drain regions and above the gate oxide film 3 interposed between these N+ impurity diffused regions 2. With the remaining photoresist 21 being as mask, the polysilicon layer 20 is isotropically removed by etching (FIG. 2G). CDE (Chemical Dry Etching) equipment by Tokuda Seisakusho Co. Ltd. was used for etching at this time.

Figure 2H:
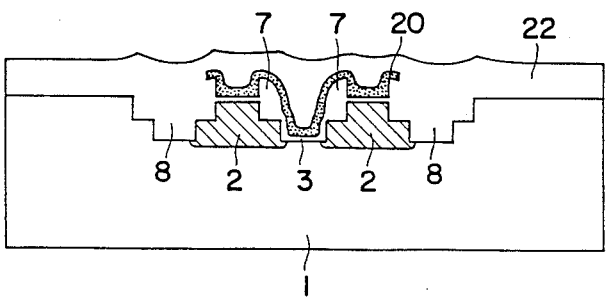

After the remaining photoresist 21 is removed, a silicon oxide film and a BPSG layer generically indicated by reference numeral 22 are deposited in succession so that their thicknesses are approx. 1000 and 2000 Å respectively. Then, melting is implemented, thus allowing the silicon oxide film and BPSG layer 22 to be flattened. At this time, the silicon oxide film and BPSG layer 22 are buried into the recessed portions on both the sides. Thus, field insulation 8 is formed (FIG. 2H).

Figure 2I:
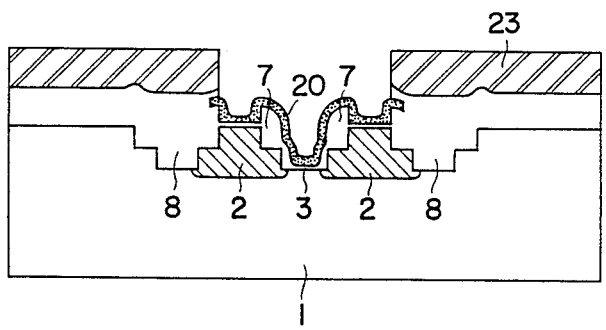
Figure 2J:
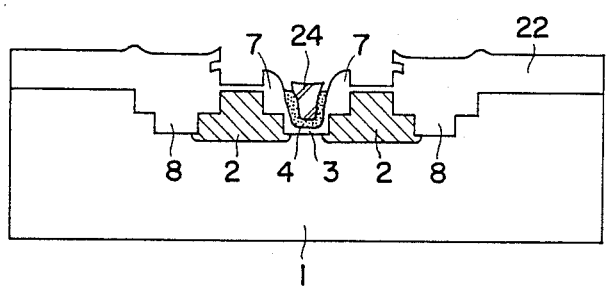

After a photoresist 23 is coated onto the entire surface, patterning is implemented to remove the photoresist 23 above the polysilicon layer 20. With the remaining photoresist 23 being as mask, the silicon oxide film and BPSG layer 22 having been flattened above the polysilicon layer 20 are removed by etching (FIG. 2I). After the remaining photoresist 23 is removed, a photoresist 24 is coated onto the entire surface for the second time to develop the photoresist 24, thus allowing the photoresist 24 only within the recessed portion 12 above the polysilicon layer 20. With the remaining photoresist 24 being as mask, the polysilicon layer 20 is isotropically removed by etching. Since the photoresist is remaining in great quantities within the recessed portion 12 at this time, the polysilicon layer 20 remains U-shaped in cross section. For etching at this time as well, CDE equipment by Tokuda Seisakusho Co. Ltd. was used. The remaining polysilicon layer 20 is to serve as the gate electrode 4 (FIG. 2J).

Figure 2K:
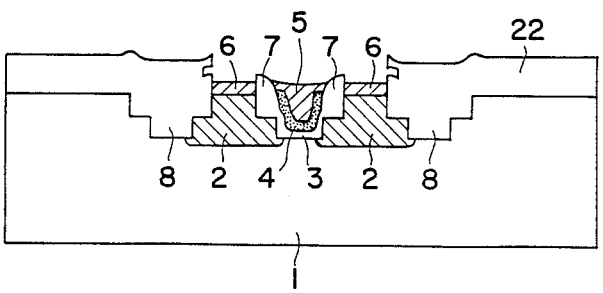
Figure 2L:
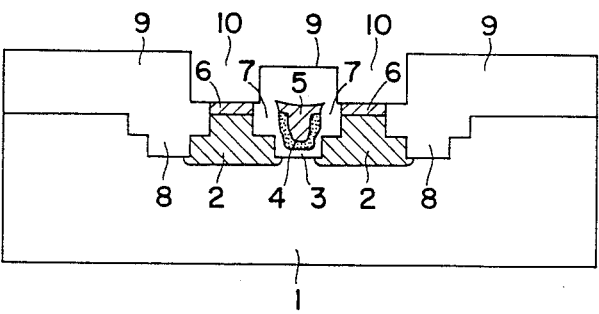

After the photoresist 24 is removed and then the gate oxide films 3 exposed above the N+ impurity diffused region 2 as the source and drain regions are removed by etching, selective CVD method is used to deposit tungsten layers 5 and 6 on the gate electrode 4 and the N+ impurity diffused regions 2 as source and drain regions so that their thicknesses are equal to 1000 Å. Thus, the gate electrode 4 in the recessed portion 12 is provided with the tungsten layer 5 thereon (FIG. 2K).

After a BPSG layer is deposited onto the entire surface by using CVD method for the second time, melting is implemented to flatten the BPSG layer. The BPSG layer and the silicon oxide film and BPSG layer 22 having been already formed are combined with each other. Thus, the flattened insulating layer 9 overlying the semiconductor substrate 1 is provided. Then, contact holes 10 are opened in the insulating layers 9 above the tungsten layers 5 and 6, respectively. The end portions of these constant holes 10 are caused to be in alignment with the end portions of the spacers 7 between which the gate electrode 4 is interposed. These contact holes are 0.7 μm in dimension (FIG. 2I). In this example, since the contact hole 10 above the tungsten layer 5 is opened at another site, the indication thereof is omitted in FIG. 2I. Further, a wiring layer (not shown) for making an electrical connection of the tungsten layers 5 and 6, i.e., the gate electrode 4 with the N+ impurity diffused region 2 as the source and drain regions is formed.

It is to be noted that while the gate electrode 4 in the recessed portion 12 is provided with the tungsten layer 5 thereon, a method may be employed to further thicken the polysilicon layer forming the gate electrode 4 to bury the recessed portion 12 with the polysilicon layer instead of the tungsten layer 5.

Moreover, while there is included in the above-mentioned embodiment a process to deposit tungsten layers 5 and 6, and thereafter to deposit BPSG layer, thus to flatten the BPSG layer by melting, spin on glass (SOG) or organic material may be coated instead of the BPSG layer, or quartz may be deposited by bias sputtering method using quartz target.

In addition, while the field ion implantation process and/or the channel ion implantation as channel stopper are omitted in the above-mentioned embodiment, these processes may be added according to need.

Figure 3A:
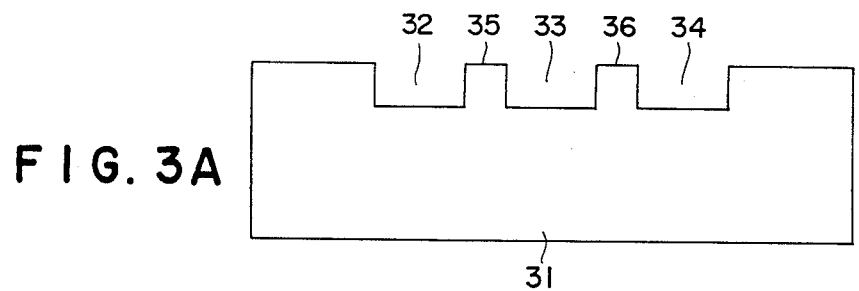
FIGS. 3A to 3G are cross sectional views of respective process steps showing a manufacturing method of another embodiment of a semiconductor device according to this invention.
Figure 3B:
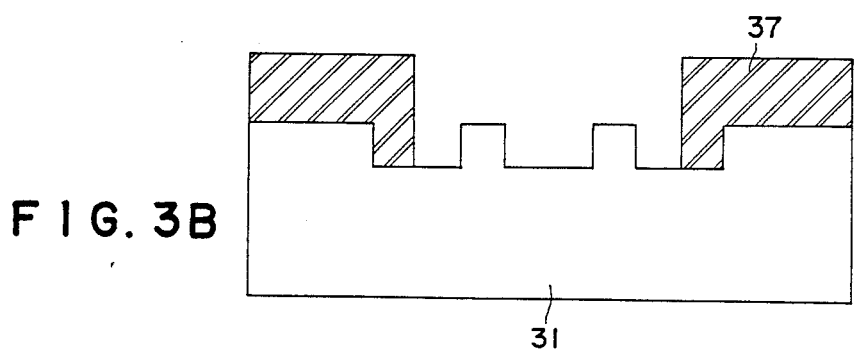
Figure 3C:
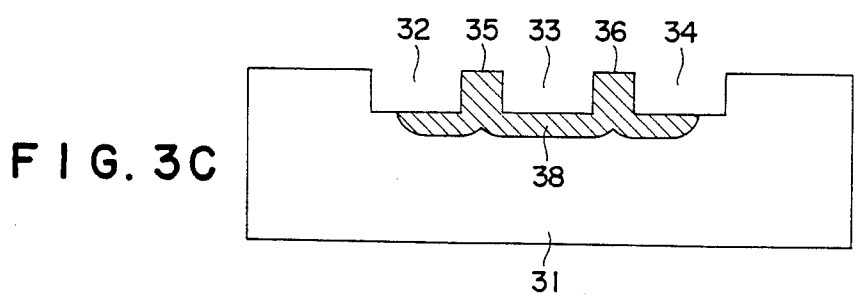

A method of manufacturing a semiconductor device according to another embodiment of the invention will be now described with reference to FIG. 3. On a semiconductor substrate 31 comprised of silicon, three recessed portions 11, 12 and 13 are formed at a minimum pitch where fining or miniaturization process is possible. Thus, two protruding remaining regions 35 and 36 interposed between these three recessed portions 32, 33 and 34 are formed (FIG. 3A). After a photoresist 37 is coated over the entire surface of the semiconductor substrate 31, parts of the photoresist 37 in the halves of the outer recessed portions 32 and 34, in the central recessed portion 33, and above the protruding portions 35 and 36 are removed (FIG. 3B). With the remaining photoresist 37 being as mask, an impurity is diffused into the surface region of the semiconductor substrate 31 to form an N+ impurity diffused region 38 to remove the remaining photoresist 37 (FIG. 3C).

Figure 3D:
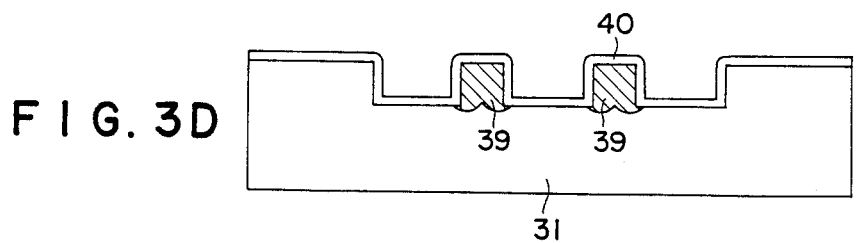

Using the anisotropic etching method, etching of the semiconductor substrate 31 is carried out. Thus, N+ impurity diffused regions 38 on the bottom surfaces of the recessed portions 32, 33 and 34 are removed by etching. The depth of the N+ impurity diffused region 38 to be removed by etching is set greater than the diffusion depth thereof. The N+ impurity diffused regions of the protruding portions 35 and 36 remaining at this process are to serve as N+ impurity diffused regions 39 as the source and drain regions. Then, after cleaning of the semiconductor substrate 31 is sufficiently carried out, a gate oxide film 40 is formed (FIG. 3D).

Figure 3E:
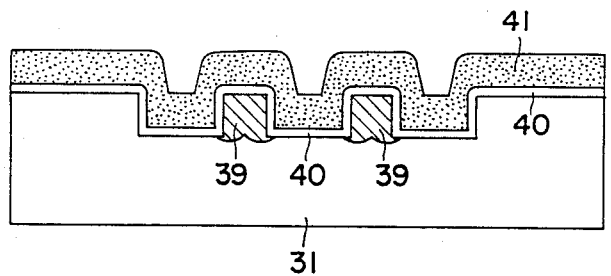
Figure 3F:
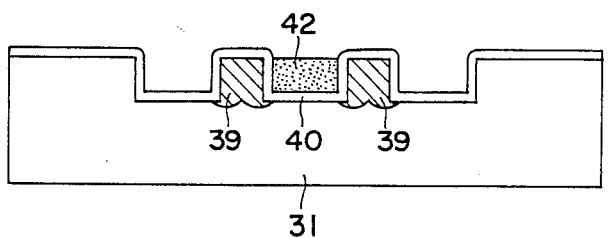

After a polysilicon layer 41 is deposited over the entire surface by using the low pressure CVD method so that it has a thickness sufficient to bury the gate oxide film 40 in the recessed portions 32, 33 and 34, an impurity is diffused into the polysilicon layer 41 (FIG. 3E). Then, after a photoresist is coated over the entire surface, patterning is implemented, thus allowing the photoresist to remain above the gate oxide film 40 interposed between the N+ impurity diffused regions 39 as the source and drain regions. With the remaining photoresist being as mask, the polysilicon layer 41 is isotropically removed by etching. The remaining polysilicon layer thus obtained is to serve as a gate electrode 42 (FIG. 3F).

Figure 3G:
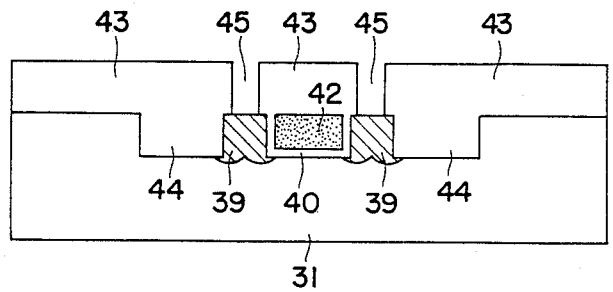

Using the CVD method, an insulating layer 43 overlying the entire surface of the semiconductor substrate 31 is formed. At this time, the recessed portions on both the sides are provided with the insulating layer 43. Thus, a field insulation 44 is provided. Then, contact holes 45 are opened at predetermined positions of the insulating layer 43 above the gate electrode 42 and the N+ impurity diffused regions 39 as the source and drain regions, respectively (FIG. 3G). It is to be noted that since the contact hole 45 on the gate electrode is opened at another site, an indication thereof is omitted in FIG. 3G. In addition, a wiring layer (not shown) for making an electrical connection between the gate electrode 42 and the N+ impurity diffused regions 39 as the source and drain regions through these contact holes 45 is formed.

It is to be noted that while the gate oxide film 40 in the central recessed portion 33 is provided with the gate electrode 42 comprised of polysilicon layer 41 thereon in accordance with the above-mentioned embodiment, an implementation may be employed to relatively thin the thickness of the polysilicon layer to be deposited to bury the gate electrode 42 in the recessed portion with a tungsten layer. In such an implementation, the tungsten layer may be deposited also on the N+ impurity diffused region 39 from which the gate oxide film 40 on the N+ impurity diffused region 39 of the protruding portions 35 and 36 has been removed. Thus, the sheet resistance is reduced, so that drivability of the transistor is improved and delay is negligible. In addition, the sheet resistance of the gate electrode is also reduced. Thus, the transistor characteristics are improved and an access speed becomes fast.

What is claimed is:

1. A semiconductor device comprising:

a semiconductor substrate of one conductivity type;

first, second and third recessed portions formed in succession at a predetermined pitch below a surface level of said semiconductor substrate;

a first pillarlike remaining region formed between said first and second recessed portions, in which an impurity of an opposite conductivity type is diffused;

a second pillarlike remaining region formed between said second and third recessed portions, in which an impurity of said opposite conductivity type is diffused wherein said first and second pillarlike remaining regions are such that their impurity diffused regions extend down to bottom surfaces of respective said recessed portions;

a gate region buried in said second recessed portion through an insulating film said gate region comprising:

an upper end surface extending to a height of at least the surface level of said semiconductor substrate; and a polysilicon layer on lower and side inner surfaces provided with a tungsten layer thereon, said first and second pillarlike remaining regions being provided with a tungsten layer on each upper surface thereof; and isolation regions buried in said first and third recessed portions.

2. A semiconductor device as set forth in claim 1 wherein said first and second pillarlike remaining regions have a cross sectional shape having a step on each side such that the lower surfaces are broader than the each upper surface thereof.

* * * * *